United States Patent
Priatna et al.

(10) Patent No.: US 8,143,891 B2
(45) Date of Patent: Mar. 27, 2012

(54) SYSTEM FOR IMAGE ACQUISITION WITH FAST MAGNETIC RESONANCE GRADIENT ECHO SEQUENCES

(75) Inventors: Agus Priatna, Ballwin, MO (US); Stephan Kannengießer, Wuppertal (DE)

(73) Assignees: Siemens Aktiengesellschaft, Munich (DE); Siemens Medical Solutions USA, Inc., Malvern, PA (US)

( * ) Notice: Subject to any disclaimer, the term of this patent is extended or adjusted under 35 U.S.C. 154(b) by 389 days.

(21) Appl. No.: 12/504,789

(22) Filed: Jul. 17, 2009

(65) Prior Publication Data

US 2010/0052675 A1 Mar. 4, 2010

Related U.S. Application Data

(60) Provisional application No. 61/092,954, filed on Aug. 29, 2008.

(51) Int. Cl.
*G01V 3/00* (2006.01)

(52) U.S. Cl. .................................................. 324/309

(58) Field of Classification Search ........... 324/300–322
See application file for complete search history.

(56) References Cited

U.S. PATENT DOCUMENTS

| | | | | |
|---|---|---|---|---|
| 4,950,992 A | * | 8/1990 | Nakabayashi et al. | 324/309 |
| 4,970,465 A | * | 11/1990 | Hagiwara | 324/309 |
| 4,983,918 A | * | 1/1991 | Nakabayashi | 324/309 |
| 4,999,581 A | * | 3/1991 | Satoh | 324/309 |
| 5,028,871 A | * | 7/1991 | Nakabayashi | 324/309 |
| 5,051,699 A | * | 9/1991 | Hanawa et al. | 324/309 |
| 5,115,812 A | * | 5/1992 | Sano et al. | 600/419 |
| 5,162,737 A | * | 11/1992 | Nozokido et al. | 324/309 |
| 5,291,891 A | * | 3/1994 | Foo et al. | 600/410 |
| 5,327,088 A | * | 7/1994 | Pipe | 324/309 |
| 5,361,028 A | * | 11/1994 | Kanayama et al. | 324/309 |
| 5,537,039 A | * | 7/1996 | Le Roux et al. | 324/309 |
| 5,545,992 A | * | 8/1996 | Foo | 324/309 |
| 5,798,642 A | * | 8/1998 | Watanabe | 324/307 |
| 5,942,897 A | * | 8/1999 | Kanazawa | 324/309 |
| 6,188,922 B1 | * | 2/2001 | Mistretta et al. | 600/419 |
| 6,288,541 B1 | * | 9/2001 | Dumoulin | 324/306 |
| 6,393,313 B1 | * | 5/2002 | Foo | 600/410 |
| 6,546,274 B2 | * | 4/2003 | Itagaki et al. | 600/413 |
| 6,580,274 B2 | * | 6/2003 | Sato | 324/318 |

(Continued)

OTHER PUBLICATIONS

Quantitative Evaluation of Several Partial Fourier Reconstruction Algorithms Used in MRI; G.McGibney, M.R. Smith, S.T. Nichols, A. Crawley. Published by the British Library (pp. 51-59); Magazine.

(Continued)

*Primary Examiner* — Dixomara Vargas
(74) *Attorney, Agent, or Firm* — Alexander J Burke (57) ABSTRACT

A system uses a three-dimensional spoiled gradient recalled echo sequence for fat suppression with reduced total acquisition time suitable for acquiring image data under breath-hold conditions using a reversed asymmetry during data acquisition on an opposed phase echo. A system reduces RF pulse repetition time in an MR imaging pulse sequence in an MR imaging device. The system includes an RF pulse generator for generating an RF excitation pulse sequence having a pulse repetition interval. A read-out gradient magnetic field generator generates an asymmetric read-out gradient magnetic field having a readout gradient mid-point occurring prior to an RF echo pulse peak. The RF echo pulse peak is received in response to a generated RF excitation pulse.

21 Claims, 13 Drawing Sheets

U.S. PATENT DOCUMENTS 7,408,346 B2* 8/2008 Szyperski et al. ............ 324/307
7,711,166 B2* 5/2010 Mistretta et al. ............. 382/128

OTHER PUBLICATIONS

Chemical Shift Phase-difference and Suppression Magnetic Resonance Imaging Techniques in Animals, Phantoms, and Humans; Mitchell et al, MR Techniques for Fatty Liver, Investigative Radiology Dec. 1991, (pp. 1041-1052); Magazine.

Fat Suppression by Saturation/Opposed-Phase Hybrid Technique: Spin Echo Versus Gradient Echo Imaging; Siegelman et al, Magnetice Resonance Imaging, vol. 13, No. 4, pp. 545-548, 1995; Magazine.

* cited by examiner

SYSTEM FOR IMAGE ACQUISITION WITH FAST MAGNETIC RESONANCE GRADIENT ECHO SEQUENCES

This is a non-provisional application of provisional application Ser. No. 61/092,954 filed Aug. 29, 2008, by A. Priatna et al.

FIELD OF THE INVENTION

This invention concerns a system for reducing RF pulse repetition time in an MR imaging pulse sequence in an MR imaging device using asymmetric read-out gradient magnetic field moments.

BACKGROUND OF THE INVENTION

Three-dimensional gradient echo MR image data acquisition is used among many other applications for contrast enhanced MR imaging of patient body organs. For this type of imaging study, it is desirable to have uniform fat suppression in the body or specific organs to allow more visibility of lesions. However, it is known that, in order to acquire MR images with uniform fat suppression, MR systems require a relatively long repetition time because an MR imaging system needs to acquire image data at an opposed phase echo time (TE). A system according to invention principles addresses this deficiency and related problems.

SUMMARY OF THE INVENTION

A system advantageously employs a three-dimensional spoiled gradient recalled echo pulse sequence for fat suppression with reduced total acquisition time suitable for acquiring image data under breath-hold conditions using a reversed echo asymmetry during data acquisition on the opposed phase echo. A system reduces RF pulse repetition time in an MR imaging pulse sequence in an MR imaging device. The system includes an RF pulse generator for generating an RF excitation pulse sequence having a pulse repetition interval. A read-out gradient magnetic field generator generates a read-out gradient magnetic field having an asymmetric moment distribution, such that the RF echo pulse peak occurs after the readout gradient mid-point. The RF echo pulse peak is received in response to a generated RF excitation pulse.

DETAILED DESCRIPTION OF THE INVENTION

A system advantageously uses reversed asymmetry of RF echo data acquisition with an opposed phase echo that enables a shorter repetition time and scan time whilst maintaining fat suppression. The system significantly reduces a breath-hold time period which is of particular benefit to severely ill patients in a clinical environment. The system in one embodiment employs a three-dimensional spoiled gradient recalled echo sequence for fat suppression with reduced total acquisition time suitable for acquiring image data under breath-hold conditions using a reversed asymmetry during data acquisition on the opposed phase echo.

The system in one embodiment, acquires uniform fat suppression image data with a short repetition time and thus a short breath-hold time period during three-dimensional spoiled gradient recalled echo image acquisition. The system is applicable for different gradient recalled echo sequences (2D or 3D, for example), using different types of fat suppression method such as using a frequency selective fat saturation pulse, a short tau inversion recovery pulse, spectrally selective inversion pulses (adiabatic or non-adiabatic) and using different types of k-space ordering method such as linear, radial, or segmented acquisition ordering. Although the system is described in the context of a fast 3D spoiled gradient recalled echo sequence, this is exemplary only. Different types of gradient echo pulse sequences are compatible with, and may use, a pulse sequence according to invention principles.

Figure 1:
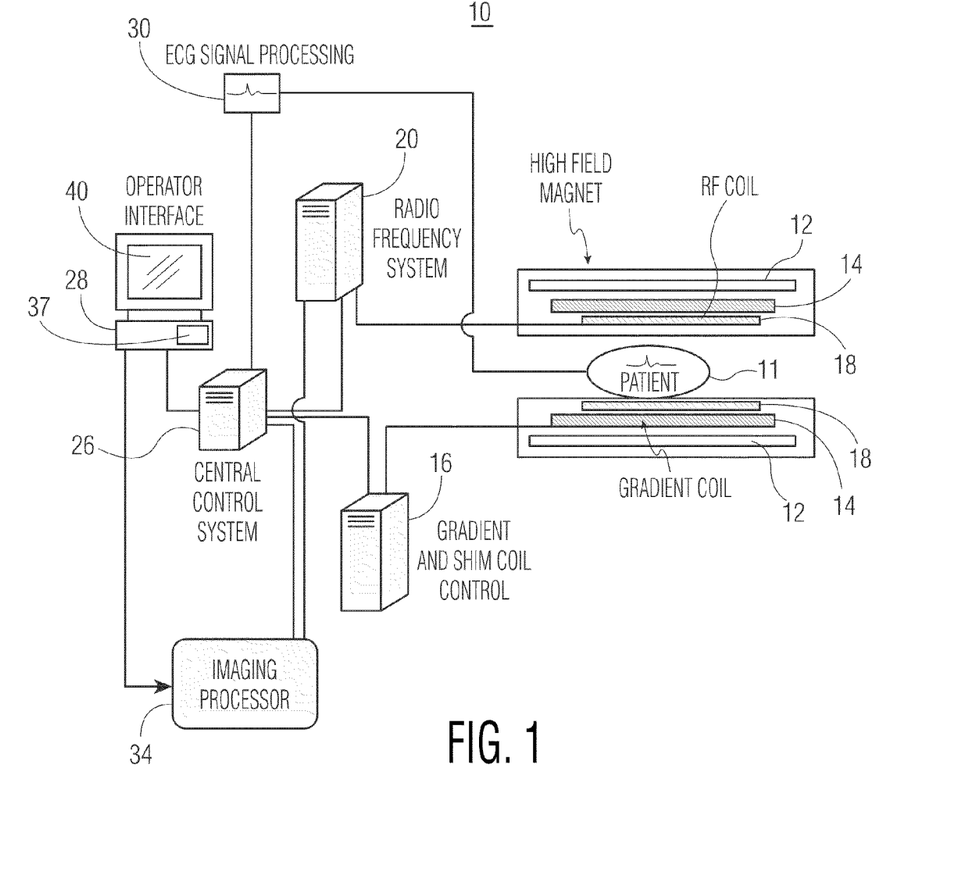
FIG. 1 shows a system for reducing RF pulse repetition time in an MR imaging pulse sequence in an MR imaging device, according to invention principles.

FIG. 1 shows system 10 for reducing RF pulse repetition time in an MR imaging pulse sequence used in an MR imaging device. System 10 employs an ECG synchronization signal generator 30, to synchronize image acquisition to a desired point within a heart cycle, for example. In system 10, magnet 12 creates a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient module 16, produce position dependent magnetic field gradients in three orthogonal directions. The magnetic field gradients include a slice-selection gradient magnetic field, a phase-encoding gradient magnetic field and a readout gradient magnetic field that are applied to patient 11. Further RF (radio frequency) generator 20 provides RF pulse signals to RF coil 18, which in response produces magnetic field pulses which rotate the spins of the protons in the imaged body 11 by ninety degrees or by one hundred and eighty degrees for so-called "spin echo" imaging, or by angles less than or equal to 90 degrees for gradient echo imaging. Pulse sequence controller 16 in conjunction with RF module 20 as directed by computer 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. RF pulse generator 20 generates an RF excitation pulse sequence having a pulse repetition interval. Read-out gradient magnetic field generator 14 generates an asymmetric read-out gradient magnetic field having a readout gradient mid-point occurring prior to an RF echo pulse peak. Read-out gradient magnetic field generator 14 adaptively adjusts an asymmetric read-out gradient magnetic field in at least one of, (a) amplitude and (b) duration time, in generating the asymmetric read-out gradient magnetic field. The RF echo pulse peak is received in response to a generated RF excitation pulse. The asymmetric read-out gradient magnetic field is provided by read out gradient coils 14, in response to gradient signals supplied by gradient module 16. The asymmetric read-out gradient magnetic field enables a reduced RF pulse repetition interval and reduces RF pulse repetition intervals in enhanced fat suppression MR imaging to reduce patient breath hold time. A data acquisition device in RF pulse generator 20 acquires RF echo data generated in response to the RF excitation pulse sequence and a controller in generator 20 asymmetrically terminates acquisition and processing of the RF echo data by early truncation of acquisition data. The data acquisition device incorporates null data (e.g., binary zero data) following a termination point in a datastream.

The MR signals detected and processed by a detector within RF module 20 provide image representative data to image data processor 34. In system 10, in response to a heart rate synchronization signal provided by ECG synchronization signal generator 30, image data processor 34 acquires an anatomical imaging data set representing a slice of patient 11 anatomy. Display processor 37 in computer 28 generates data representing at least one two dimensional display image using the imaging data set. Central control unit 26 uses information stored in an internal database comprising predetermined pulse sequence and strength data as well as data indicating timing, orientation and spatial volume of gradient magnetic fields to be applied in imaging and adjusts other parameters of system 10, so as to process the detected MR signals in a coordinated manner to generate high quality images of a selected slice (or slices) of the body. Generated images are presented on display 40. Computer 28 includes a graphical user interface (GUI) enabling user interaction with central controller 26 and enabling user modification of magnetic resonance imaging signals in substantially real time. A data acquisition device in unit 20, in conjunction with processor 34 and display processor 37, processes the magnetic resonance signals to provide image representative data for display on display 40, for example.

Figure 2:
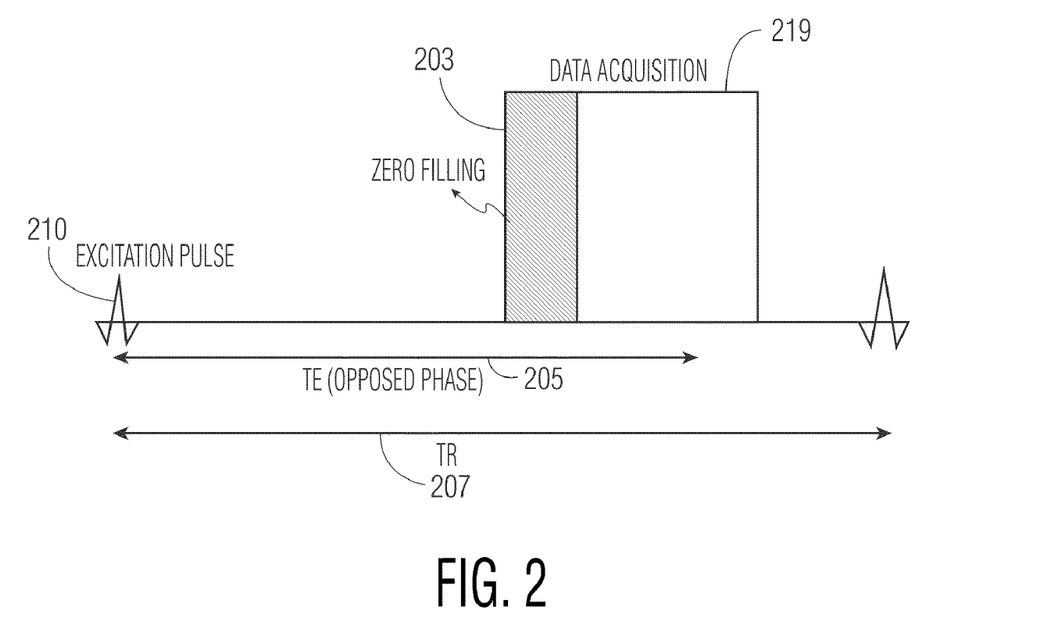
FIG. 2 illustrates a pulse sequence of known spoiled gradient recalled echo image acquisition at opposed phase TE during asymmetric acquisition.
Figure 3:
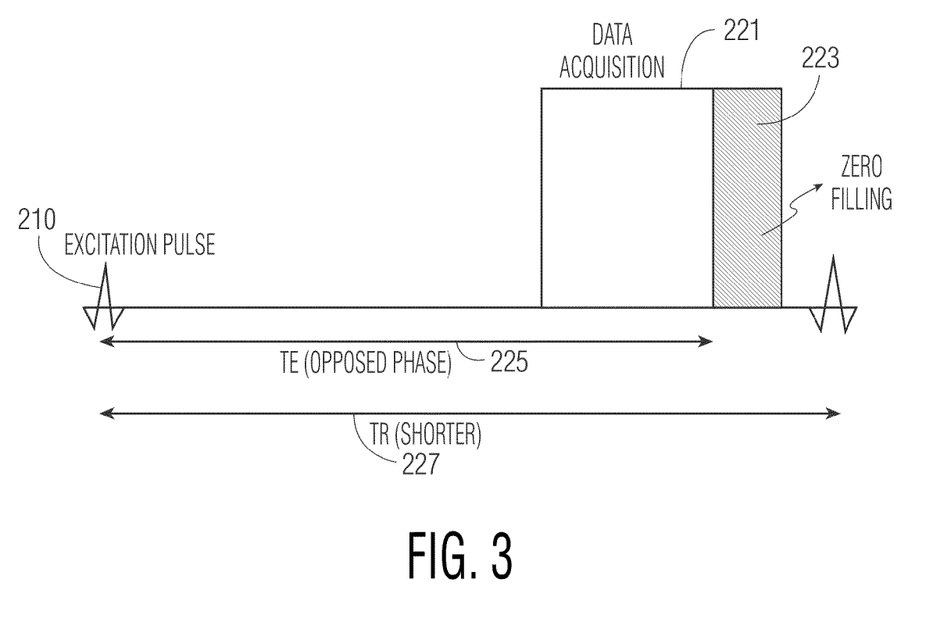
FIG. 3 illustrates a pulse sequence of a spoiled gradient recalled echo image acquisition at opposed phase TE with a reversed asymmetric acquisition, according to invention principles.

FIG. 2 illustrates a pulse sequence of a known spoiled gradient recalled echo image acquisition at opposed phase TE during asymmetric acquisition. MR image data with fat signal suppression is acquired using the pulse sequence of FIG. 2 on the opposed phase of echo time (TE) 205 of the asymmetric acquisition following RF excitation pulse 210 having repetition interval (TR) 207. The fat signal is suppressed well at the opposed phase TE, however, the acquisition lengthens the repetition time (TR), lengthens the MR image scan time and results in a relatively long breath-hold acquisition time. Data acquisition is suppressed during initial period 203 of the data acquisition window 219. The missing data during period 203 is typically zero filled. In contrast, FIG. 3 illustrates a pulse sequence of a spoiled gradient recalled echo image acquisition at opposed phase TE 225 with a reversed asymmetric acquisition, according to invention principles. The spoiled gradient recalled echo acquisition at opposed phase TE with reversed asymmetric acquisition of FIG. 3 also suppresses the fat signal well and advantageously has a shorter TR 227 and shorter scan time. Data acquisition is truncated at the end of the echo during period 223 of data acquisition window 221. The missing data is zero filled or reconstructed using Fourier principles employing redundant information in the half of the MR signal preceding the echo peak that is present because of the symmetry of the echo.

Figure 4A:
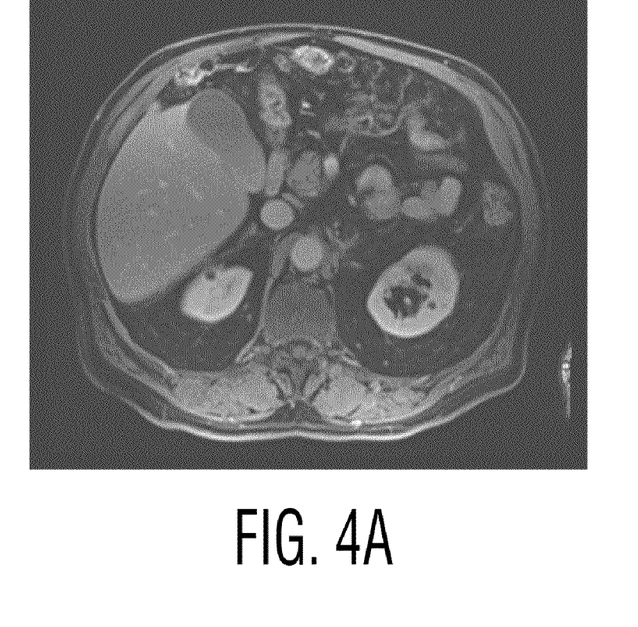
FIGS. 4A and 4B show images produced using a fat suppressed 3D fast spoiled gradient recalled echo sequence of an abdomen acquired at the opposed phase TE with known asymmetric acquisition and with a reversed asymmetric acquisition respectively, according to invention principles.
Figure 4B:
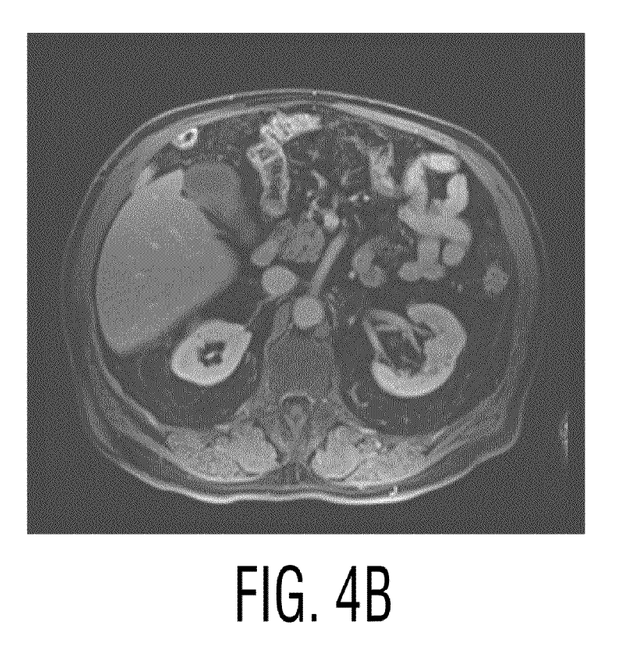

FIGS. 4A and 4B show images produced using a fat suppressed 3D fast spoiled gradient recalled echo sequence of an abdomen acquired at the opposed phase TE with known asymmetric acquisition (FIG. 4A) and with a reversed asymmetric acquisition, according to invention principles (FIG. 4B). System 10 (FIG. 1) employs a pulse sequence comprising a three-dimensional fast spoiled gradient echo sequence (or Volume Interpolated Breath hold Excitation) with a spectrally selective inversion pulse to suppress a fat signal. The fat suppression is well observed on both images but the scan time using system 10 is advantageously shorter than for the known method. For a typical high resolution clinical protocol with 320 base resolutions as shown in the images, the repetition time is reduced by about 0.5 msec using system 10 and the total acquisition time is reduced by about 3 seconds, which is a substantial improvement for breath-hold acquisition. Specifically, for the same 3D sequence as FIG. 4A, system 10 employs a reversed asymmetric acquisition pulse sequence to acquire an image sequence including the image of FIG. 4B at the opposed phase TE with a repetition time reduced to 4.5 msec and total scan time reduced to 17.22 seconds. The fat suppression is as good as with the known method but the scan time is reduced significantly by 2.76 seconds. In comparison, the known asymmetric acquisition of the same image sequence including FIG. 4A has a repetition time of 5 msec and a total scan time for the acquisition of 19.98 seconds.

System 10 reduces breath-hold scan time so imaging is less susceptible to motion and breathing artifacts and is advantageously usable for MR image scanning of critically ill patients under breath-hold conditions and may use a higher spatial resolution for the same image scan time. Clinical applications that benefit from use of system 10 include dynamic contrast enhanced image studies of the liver, breast, lungs and other body organs and general abdomen scans, for example. System 10 is usable to shorten TR (not TE) and is not limited to Fat suppression applications but is usable in other situations such as where a certain amount of T2 weighting is required, for example. The transverse (or spin-spin) relaxation time $T_2$ is the decay constant for a proton spin component and $T_1$ is the longitudinal (or spin-lattice) relaxation time $T_1$ decay constant, as known.

Figure 5:
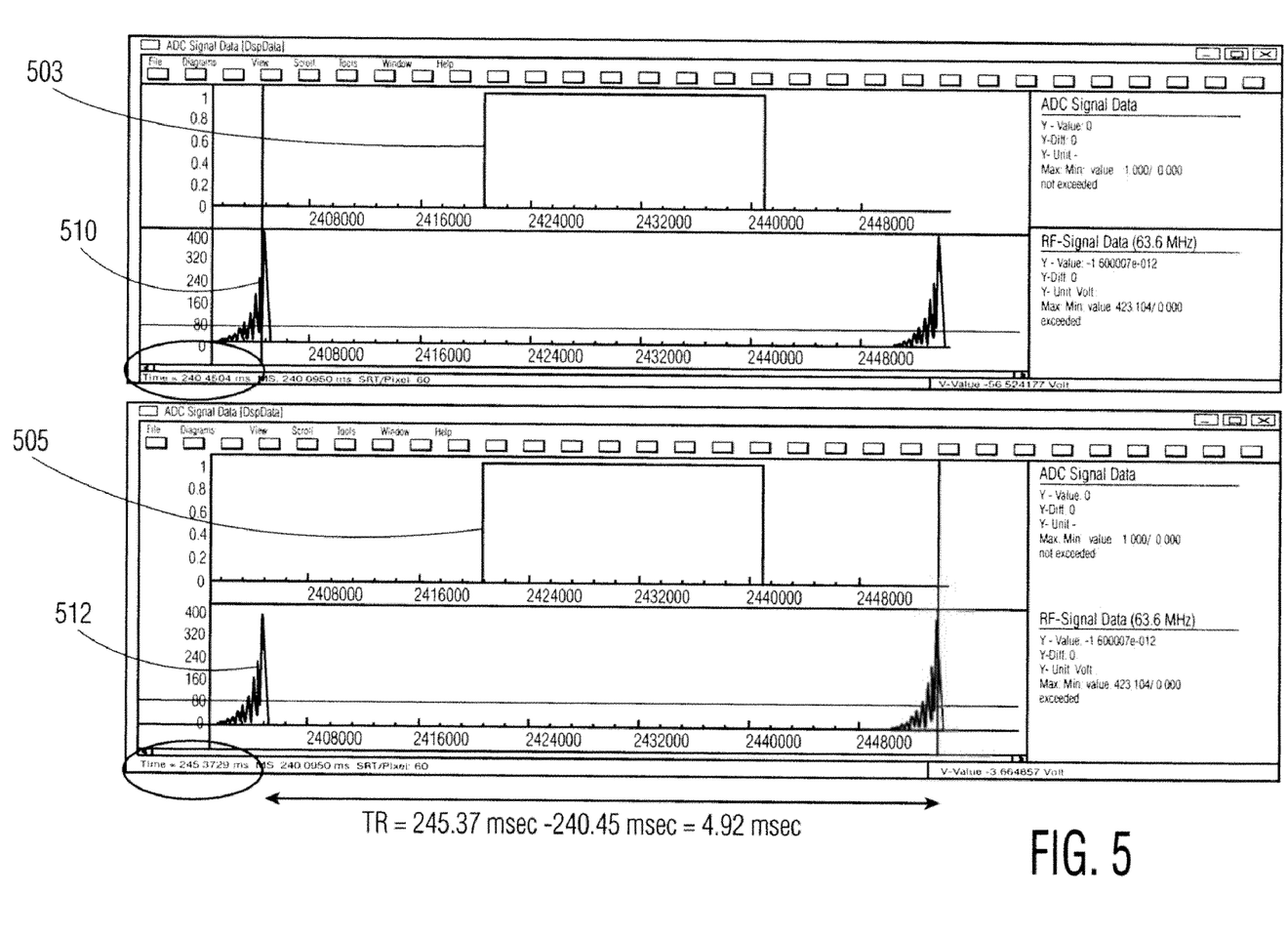
FIGS. 5 and 6 show a known pulse sequence and a sequence according to invention principles respectively, for fat suppressed 3D fast spoiled gradient recalled echo sequence imaging showing shortening of the TR (repetition time) and thus the total scan time.
Figure 6:
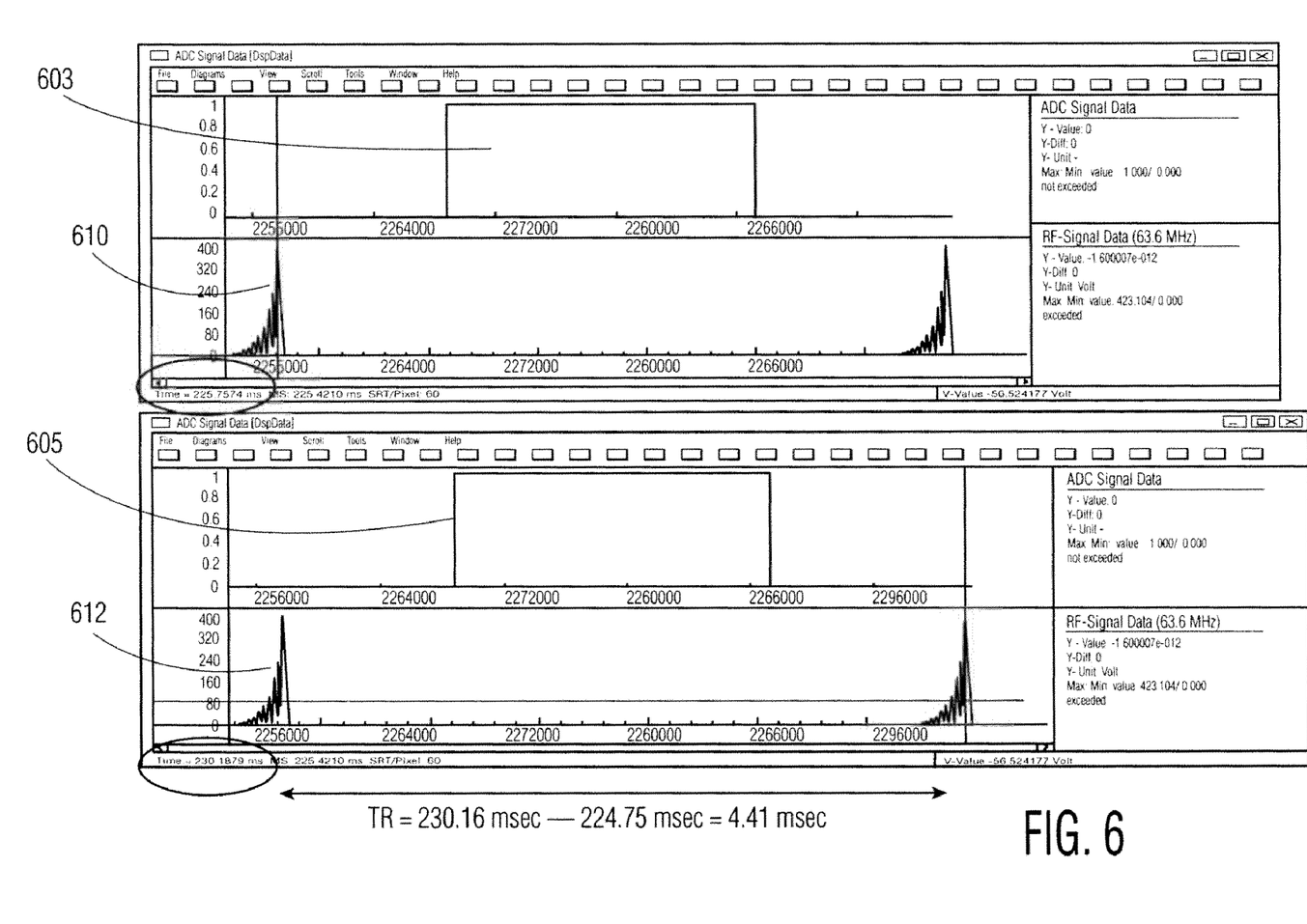

FIGS. 5 and 6 show a known pulse sequence and a sequence according to invention principles respectively, for fat suppressed 3D fast spoiled gradient recalled echo sequence imaging, showing shortening of the TR (repetition time) and thus total scan time. Specifically, FIG. 5 illustrates a TR time of 4.92 msec determined between successive RF excitation pulses 510 and 512 (having scan times of 240.45 and 245.37 msec respectively) used in known spoiled gradient recalled echo sequence imaging. Pulses 503 and 505 show associated read out window timing. FIG. 6 illustrates an advantageously reduced TR time of 4.41 msec determined between successive RF excitation pulses 610 and 612 (having scan times of 224.75 and 230.16 msec respectively) used in spoiled gradient recalled echo sequence imaging with a reversed asymmetry of acquisition for the opposed phase echo. Pulses 603 and 605 show associated read out window timing.

Figure 7A:
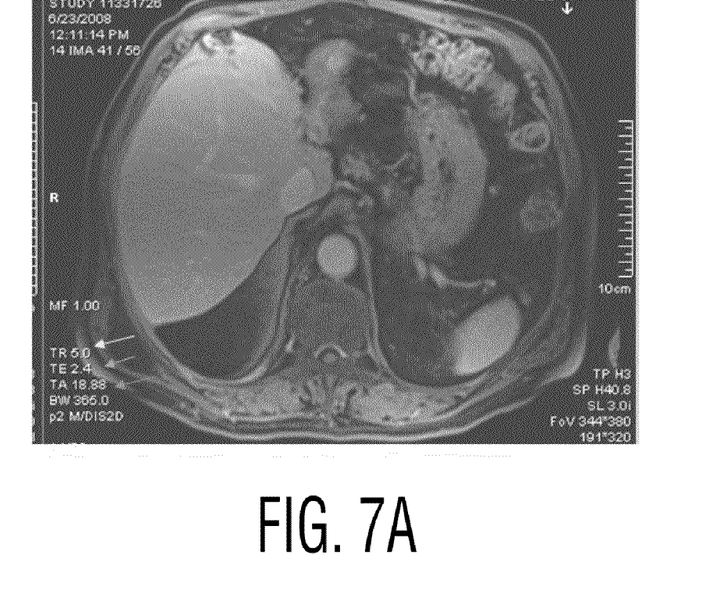
FIGS. 7A and 7B show images produced using a fat suppressed 3D fast spoiled gradient recalled echo sequence of an abdomen acquired at the opposed phase TE with known asymmetric acquisition and with a reversed asymmetric acquisition, according to invention principles, respectively.
Figure 7B:
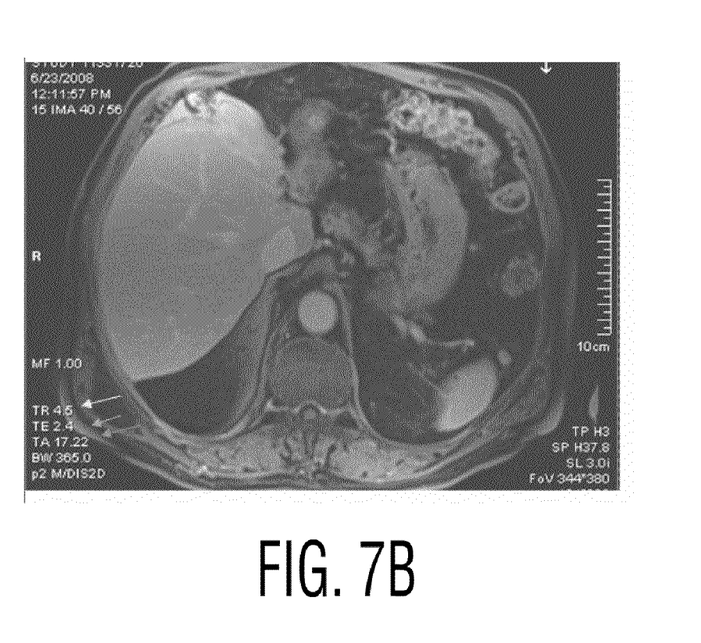

FIGS. 7A and 7B show images produced using a fat suppressed 3D fast spoiled gradient recalled echo sequence of an abdomen acquired at the opposed phase TE with known asymmetric acquisition (FIG. 7A) and in contrast with a reversed asymmetric acquisition (FIG. 7B), according to invention principles. The images of FIGS. 7A and 7B are acquired with a 5 msec and reduced 4.5 msec TR respectively. Similarly, the images of FIGS. 7A and 7B are acquired in a sequence with an 18.88 msec and reduced 17.22 msec Total scan time, respectively. The Echo time (TE) is 2.4 msec for both images. Both images exhibit good fat suppression.

Figure 8:
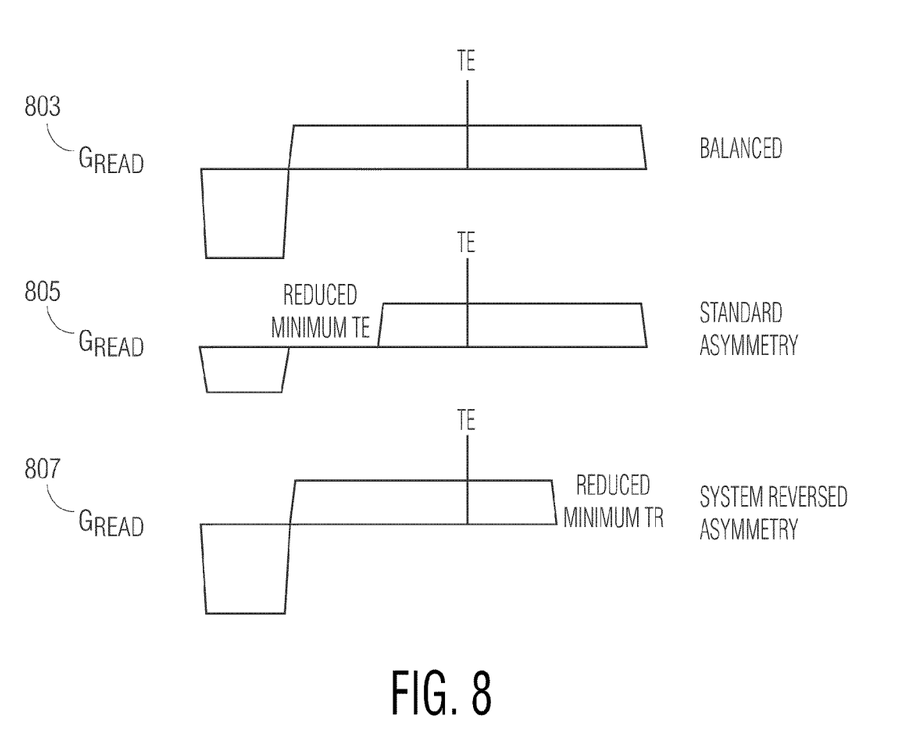
FIG. 8 illustrates known balanced and asymmetric magnetic read out gradient fields and a reversed asymmetric gradient field according to invention principles.

FIG. 8 illustrates known balanced and asymmetric magnetic read out gradient fields and a reversed asymmetric gradient field. Specifically, balanced magnetic read out gradient fields 803 and asymmetric magnetic read out gradient field 805 are produced by known systems. In contrast, system 10 advantageously provides reversed asymmetric magnetic read out gradient field 807 enabling reduced TR and reduced total imaging scan time duration.

Figure 9:
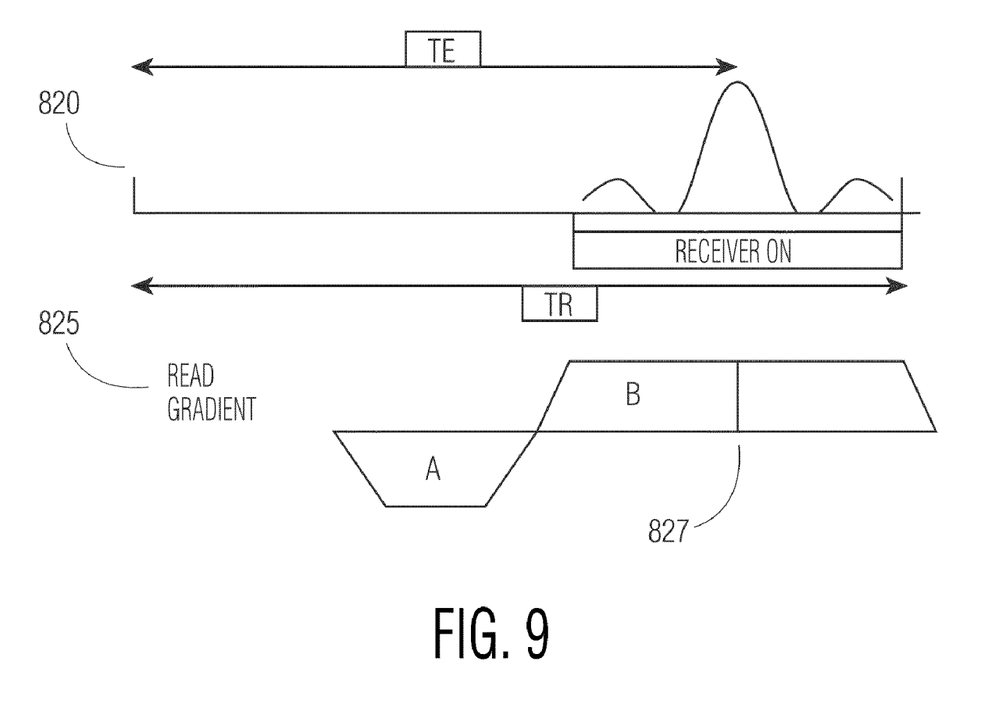
FIG. 9 illustrates timing of a known balanced magnetic read out gradient field.
Figure 10:
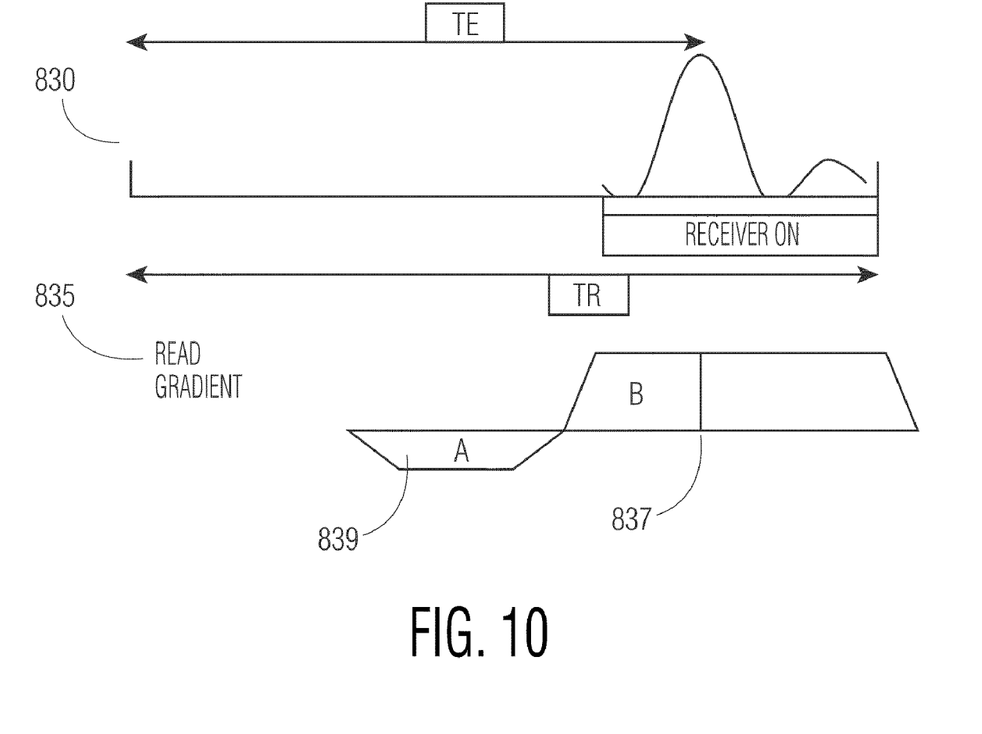
FIG. 10 illustrates timing of a known asymmetric magnetic read out gradient field.

FIG. 9 illustrates timing of a known balanced magnetic read out gradient field. A known pulse sequence involves RF excitation pulse timing 820 and a read out magnetic gradient 825. Read out magnetic gradient field 825 shifts a gradient echo time TE 827 in pulse timing 820 so areas A and B of gradient 825 are equal. In this known balanced magnetic read out gradient pulse sequence, substantially the same number of image data points are sampled either side of echo center point 827. FIG. 10 illustrates timing of a known asymmetric magnetic read out gradient field. A known pulse sequence involves RF excitation pulse timing 830 and a read out magnetic gradient 835. Read out magnetic gradient field 835 shifts gradient echo time TE 837 in pulse timing 830 so that area A and B of gradient 835 are equal, however, the A lobe 829 of the read out magnetic gradient field is reduced so the echo time TE 837 arrives earlier and the magnetic read out gradient field is asymmetric. The echo time is now shorter but has some information missing compared to the balanced case of FIG. 9. The missing data is zero filled or reconstructed using Fourier principles employing redundant information in the half of the MR signal following the echo peak that is present because of the symmetry of the echo.

Figure 11:
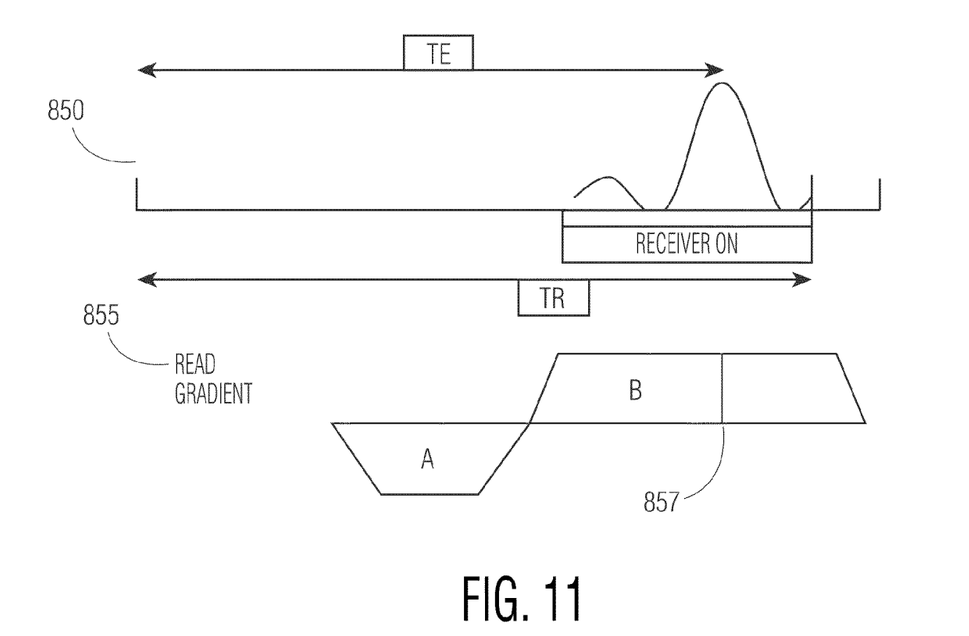
FIG. 11 illustrates timing of a reversed asymmetric magnetic read out gradient field, according to invention principles.
Figure 12A:
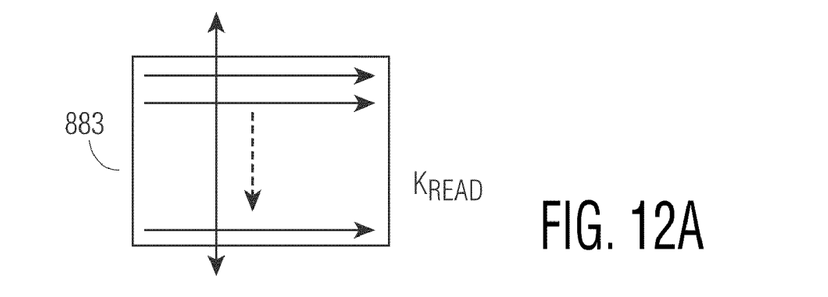
FIG. 12 shows re-ordering of elements in K-space frequency domain used with a reversed asymmetric magnetic read out gradient field, according to invention principles as well as known k-space ordering.
Figure 12B:
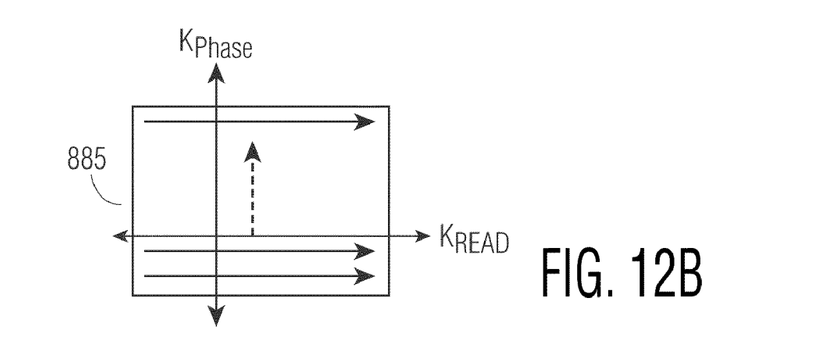
Figure 12C:
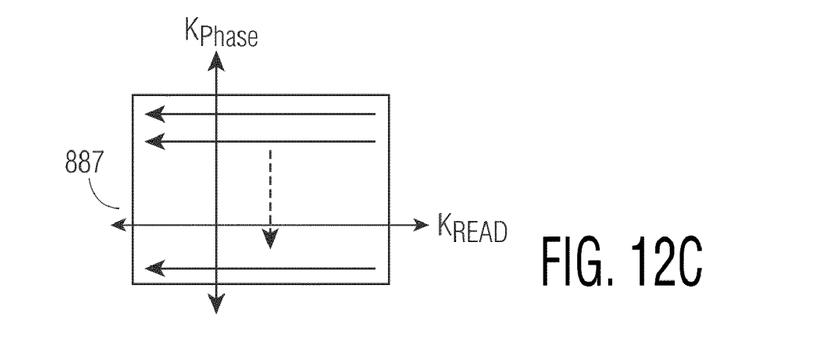
Figure 12D:
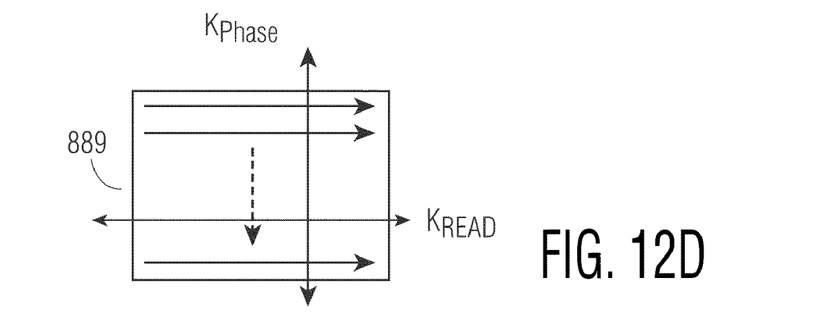

FIG. 11 illustrates timing of a reversed asymmetric magnetic read out gradient field, according to invention principles. A pulse sequence involves RF excitation pulse timing 850 and a read out magnetic gradient 855. Magnetic read out gradient 855 shifts a gradient echo to TE time 857 in pulse timing 850 when area A and B of gradient 855 are equal. FIG. 11 illustrates timing that is substantially the same as the balanced symmetry case of FIG. 9 so that the center of the echo arrives at a time when area A equals area B of the read out gradient field but data acquisition at the end of the echo is truncated. The missing data is zero filled or reconstructed using Fourier principles employing redundant information in the half of the MR signal preceding the echo peak that is present because of the symmetry of the echo.

FIG. 12 shows re-ordering of elements in K-space frequency domain used with a reversed asymmetric magnetic read out gradient field, according to invention principles in contrast to a known k-space ordering. K-space is temporary image data space (e.g., in unit 20 FIG. 1) in which data in the spatial frequency domain derived from digitized MR signals is stored during image data acquisition. When k-space is full (at the end of an image scan), the k-space data is mathematically processed to produce a final image. Thus k-space holds raw data before reconstruction. K-space data is derived by a 2D-Fourier Transform of the encoded MR signal and represents the spin density distribution in two dimensions. Thus position (x,y) and spatial frequency constitute a Fourier transform pair. Also, k-space has the same number of rows and columns as a final image. During an imaging scan, k-space is filled with raw data so that one line (e.g., row) of k-space data is created per TR (Repetition Time).

K-space plot 883 (FIG. 12) shows a known k-space ordering of storage of frequency domain data elements upon image acquisition in a 2D storage array. Specifically, acquired k-space data elements of individual TR intervals are stored in corresponding individual k-space rows from left to right and progressively through a data acquisition interval as frequency (and phase) changes from top to bottom. Similarly, known K-space plot 885 shows re-ordered k-space storage of frequency domain data elements upon image acquisition in a 2D storage array. Specifically, acquired k-space data elements of individual TR intervals are stored in corresponding individual k-space rows from left to right and progressively through a data acquisition interval as frequency (and phase) changes from bottom to top.

In contrast, K-space plot 887, shows a re-ordered k-space storage of frequency domain data elements upon image acquisition in a 2D storage array, in one embodiment according to invention principles. In response to a reversed asymmetric magnetic read out gradient field, acquired k-space data elements of individual TR intervals are stored in corresponding individual k-space rows from right to left and progressively through a data acquisition interval as frequency (and phase) changes from top to bottom. In another embodiment, K-space plot 889 shows a re-ordered k-space storage of frequency domain data elements upon image acquisition in a 2D storage array, according to invention principles. In response to a reversed asymmetric magnetic read out gradient field, acquired k-space data elements of individual TR intervals are stored in corresponding individual k-space rows from left to right and progressively through a data acquisition interval as frequency (and phase) changes from top to bottom. Missing data in k-space storage resulting from truncation of data acquisition at the end of an echo with use of a reversed asymmetric magnetic read out gradient field, is zero filled or reconstructed using Fourier principles. Reconstruction is achieved using redundant information in the half of the MR signal preceding the echo peak that is present because of the symmetry of the echo. Such reconstruction and partial Fourier reconstruction to filter a truncated end of acquired image data and fill the rest of a data matrix up with zeros, for example, is known as indicated in, Quantitative-evaluation of several partial Fourier reconstruction algorithms used in MRI. Magnetic Resonance in Medicine, 30, 51-59. (1993) by G McGibney, MR Smith, S T Nichols, and A Crawley.

Figure 13:
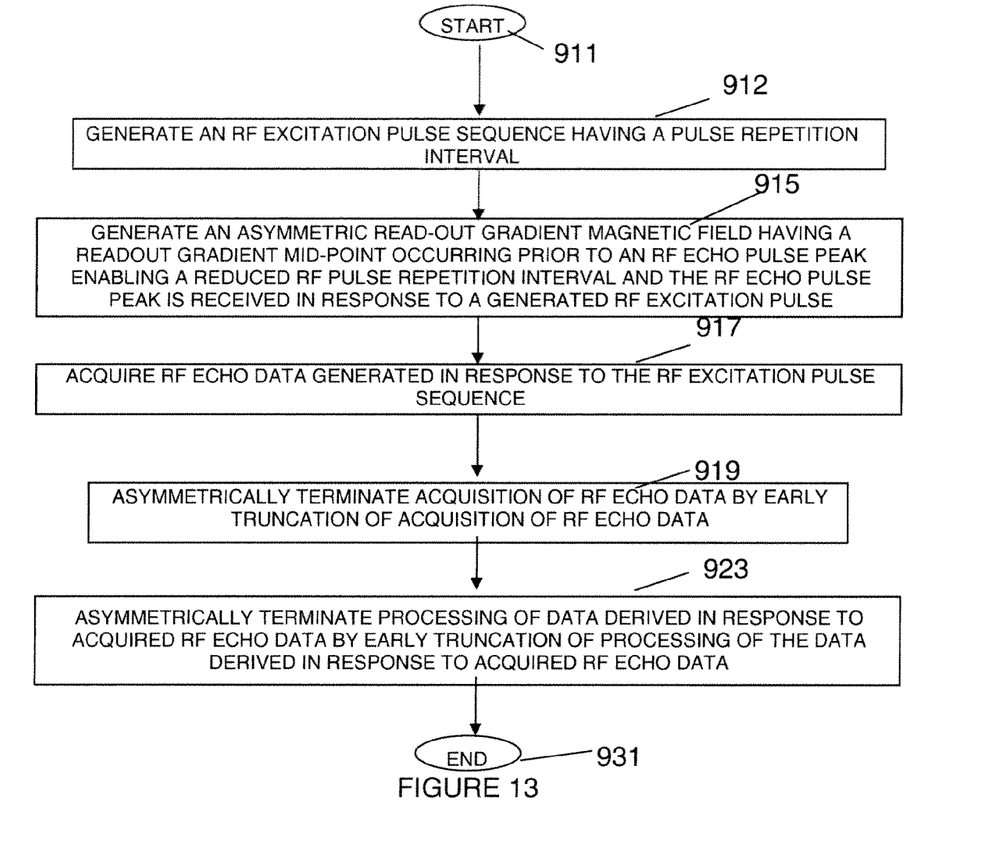
FIG. 13 shows a flowchart of a process performed by a system for reducing RF pulse repetition time in an MR imaging pulse sequence in an MR imaging device, according to invention principles.

FIG. 13 shows a flowchart of process performed by system 10 (FIG. 1) for reducing RF pulse repetition time in an MR imaging pulse sequence in an MR imaging device. In step 912 following the start at step 911, RF pulse generator 20 generates an RF excitation pulse sequence having a pulse repetition interval. A read-out gradient magnetic field generator comprising read out gradient coils 14 and gradient module 16 in step 915, generates an asymmetric read-out gradient magnetic field having a readout gradient mid-point occurring prior to an RF echo pulse peak enabling a reduced RF pulse repetition interval in enhanced fat suppression MR imaging to reduce patient breath hold time. The RF echo pulse peak is received in response to a generated RF excitation pulse. The read-out gradient magnetic field generator adaptively adjusts an asymmetric read-out gradient magnetic field in at least one of, (a) amplitude and (b) duration time, in generating the asymmetric read-out gradient magnetic field.

In step 917, a data acquisition device in RF pulse generator 20 acquires RF echo data generated in response to the RF excitation pulse sequence. In step 919, the data acquisition device asymmetrically terminates acquisition of RF echo data by early truncation of acquisition of RF echo data. In step 923, a controller in the data acquisition device asymmetrically terminates processing of data derived in response to acquired RF echo data by early truncation of processing of the data derived in response to acquired RF echo data. The data acquisition device at least one of, (a) substitutes null data (e.g., binary zero data) for truncated RF echo data and (b) reconstructs truncated RF echo data from redundant information in the acquired RF echo data using Fourier principles. The data acquisition device reconstructs truncated RF echo data from redundant information in the acquired RF echo data using Fourier principles. The data acquisition device incorporates the null data or reconstructed truncated RF echo data in a k-space data storage array. The data acquisition device also employs a reordered storage of data, derived from the RF echo data, in k-space, to accommodate the truncation of acquisition of RF echo data. The process of FIG. 13 terminates at step 931.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-13 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses a reversed asymmetry of RF echo data acquisition with an opposed phase echo that enables use of a shorter repetition time, breath-hold time and scan time whilst maintaining fat suppression. Further, the processes and applications may, in alternative embodiments, be located on one or more (e.g., distributed) processing devices on the network of FIG. 1. Any of the functions and steps provided in FIGS. 1-13 may be implemented in hardware, software or a combination of both.

What is claimed is:

1. A system for reducing RF pulse repetition time in an MR imaging pulse sequence in an MR imaging device, comprising:
   an MR imaging system including,
      an RF pulse generator for generating an RF excitation pulse sequence having a pulse repetition interval; and
      a read-out gradient magnetic field generator for generating a read-out gradient magnetic field with asymmetric moment distribution having an RF echo pulse peak occurring after the readout gradient mid-point, said RF echo pulse peak being received in response to a generated RF excitation pulse.

2. A system according to claim 1, wherein
   said asymmetric read-out gradient magnetic field moment distribution enables a reduced RF pulse repetition interval.

3. A system according to claim 1, including
a data acquisition device for asymmetrically terminating acquisition of RF echo data by early truncation of acquisition data.

4. A system according to claim 1, including,
a data acquisition device for acquiring RF echo data generated in response to said RF excitation pulse sequence and
a controller for asymmetrically terminating processing of data derived in response to acquired RF echo data by early truncation of processing of said data derived in response to acquired RF echo data.

5. A system according to claim 1, wherein
said system reduces RF pulse repetition intervals in enhanced fat suppression MR imaging to reduce patient breath hold time.

6. A system according to claim 1, wherein
said read-out gradient magnetic field generator adaptively adjusts an asymmetric read-out gradient magnetic field in at least one of, (a) amplitude and (b) duration time, in generating said asymmetric read-out gradient magnetic field.

7. A system according to claim 1, including
a data acquisition device for asymmetrically terminating acquisition of RF echo data by early truncation of acquisition of RF echo data and incorporating null data substituting for truncated missing data.

8. A system according to claim 7, wherein
said mill data comprises binary zero data.

9. A system according to claim 1, including
a data acquisition device for asymmetrically terminating acquisition of RF echo data by early truncation of acquisition data and using Fourier principles in reconstructing missing data from redundant data in the acquired RF echo data.

10. A system according to claim 1, including
a data acquisition device for asymmetrically terminating acquisition of RF echo data by early truncation of acquisition of RF echo data and employing a reordered storage of data derived from the RF echo data in k-space to accommodate the truncation of acquisition data.

11. A system for reducing RF pulse repetition time in an MR imaging pulse sequence in an MR imaging device, comprising:
an MR imaging system including,
an RF pulse generator for generating an RF excitation pulse sequence having a pulse repetition interval;
a read-out gradient magnetic field generator for generating a mad-out gradient magnetic field with asymmetric moment distribution having an RF echo pulse peak occurring after the readout gradient mid-point enabling a reduced RF pulse repetition interval, said RF echo pulse peak being received in response to a generated RF excitation pulse; and
a data acquisition device for acquiring RF echo data generated in response to said RF excitation pulse sequence and asymmetrically terminating acquisition of RF echo data by early truncation of acquisition data.

12. A system according to claim 11, wherein
said read-out gradient magnetic field generator adaptively adjusts an asymmetric read-out gradient magnetic field in duration time, in generating said asymmetric read-out gradient magnetic field.

13. A system according to claim 11, wherein
said data acquisition device at least one of, (a) substitutes null data for truncated RF echo data and (b) reconstructs truncated RF echo data from redundant information in the acquired RF echo data using Fourier principles.

14. A system according to claim 13, wherein
said null data comprises binary zero data.

15. A system according to claim 13 wherein
said data acquisition device incorporates said null data in a k-space data storage array.

16. A system according to claim 13 wherein
said data acquisition device incorporates reconstructed truncated RF echo data in a k-space data storage array.

17. A system according to claim 16 wherein
said data acquisition device incorporates said null data in a k-space data storage array.

18. A system according to claim 11, wherein
said data acquisition device reconstructs truncated RF echo data from redundant information in the acquired RF echo data using Fourier principles.

19. A system according to claim 11, wherein
said data acquisition device employs a reordered storage of data, derived from the RF echo data, in k-space, to accommodate the truncation of acquisition of RF echo data.

20. A method for reducing RF pulse repetition time in an MR imaging pulse sequence in an MR imaging device, comprising the activities of:
employing an MR imaging system in,
generating an RF excitation pulse sequence having a pulse repetition interval; and
generating a read-out gradient magnetic field with asymmetric moment distribution having an RF echo pulse peak occurring after the readout gradient mid-point enabling a reduced RF pulse repetition interval, said RF echo pulse peak being received in response to a generated RF excitation pulse.

21. A method according to claim 20, including the activity of
acquiring RF echo data generated in response to said RF excitation pulse sequence and asymmetrically terminating acquisition of RF echo data by early truncation of acquisition data.

* * * * *